United States Patent [19]

Darbee

[11] Patent Number: 5,515,052
[45] Date of Patent: May 7, 1996

[54] UNIVERSAL REMOTE CONTROL WITH FUNCTION SYNTHESIS

[75] Inventor: Paul V. Darbee, Santa Anna, Calif.

[73] Assignee: Universal Electronics Inc., Twinsburg, Ohio

[21] Appl. No.: 291,350

[22] Filed: Aug. 16, 1994

Related U.S. Application Data

[63] Continuation of Ser. No. 913,523, Jul. 14, 1992, abandoned, which is a continuation-in-part of Ser. No. 586,957, Sep. 24, 1990, abandoned, which is a division of Ser. No. 127,999, Dec. 2, 1987, Pat. No. 4,959,810, which is a continuation-in-part of Ser. No. 109,336, Oct. 14, 1987, abandoned.

[51] Int. Cl.$^6$ .................................................. G08C 19/12
[52] U.S. Cl. ...................... 341/176; 340/825.57; 359/142
[58] Field of Search ............................ 340/825.69, 825.57, 340/825.72; 341/176; 455/151.4, 352; 348/734; 359/142–148; 380/52

[56] References Cited

U.S. PATENT DOCUMENTS

| | | | |
|---|---|---|---|
| 4,121,198 | 10/1978 | Tsuboi et al. | 367/199 |
| 4,177,453 | 12/1979 | Collins | 367/199 |
| 4,231,031 | 10/1980 | Crowther et al. | 340/825.63 |
| 4,246,611 | 1/1981 | Davies | 348/734 |
| 4,251,805 | 2/1981 | Holzmann et al. | 341/29 |
| 4,251,812 | 2/1981 | Okada et al. | 341/176 |
| 4,318,130 | 3/1982 | Heuer | 348/733 |
| 4,338,632 | 7/1982 | Falater | 348/734 |
| 4,425,647 | 1/1984 | Collins et al. | 359/146 X |
| 4,426,662 | 1/1984 | Skerlos et al. | 348/734 |
| 4,482,947 | 11/1984 | Zato et al. | 348/734 X |
| 4,626,848 | 12/1986 | Ehlers | 340/825.69 |
| 4,703,359 | 10/1987 | Rumbolt et al. | 358/194.1 |
| 4,774,511 | 9/1988 | Rumbolt et al. | 340/825.69 |
| 4,841,368 | 6/1989 | Rumbolt et al. | 358/194.1 |
| 4,959,810 | 9/1990 | Darbee et al. | 364/900 |
| 5,097,260 | 3/1992 | Ahn | 358/194.1 X |

FOREIGN PATENT DOCUMENTS

| | | |
|---|---|---|
| 0002435 | 9/1978 | Germany. |
| 3313493 | 10/1984 | Germany. |
| 1487784 | 10/1977 | United Kingdom. |

*Primary Examiner*—Thomas Mullen
*Attorney, Agent, or Firm*—Thomas R. Vigil

[57] ABSTRACT

The universal remote control comprises: light emitting circuitry; driver circuitry coupled to the light emitting circuitry; a microprocessor including a CPU coupled to the driver circuitry, structure, such as a keyboard, coupled to the CPU for communicating "code signal generation sequences" including a "code generate command" signal followed by a "code setting" signal to the CPU, a memory for storing information therein coupled to the CPU, program instructions stored in the memory, and, signal determining and function code creating program and circuitry associated with the memory and the CPU for determining when a "code signal generation sequence" has been received and for using the "code setting" signal of the sequence received to create a function code, comprising, a specific IR blink code, defined by a series of infra-red "light on-light off" pulses, defining a code signal for causing a controlled apparatus to execute a specific function, e.g., "volume up", and for energizing the driver circuitry to cause the light emitting circuitry to emit the specific series of infra-red "light on-light off" pulses defining the specific code signal to the controlled apparatus.

14 Claims, 9 Drawing Sheets

UNIVERSAL REMOTE CONTROL WITH FUNCTION SYNTHESIS

CROSS REFERENCE TO RELATED APPLICATIONS

This application is a continuation of U.S. application Ser. No. 07/913,523 filed on Jul. 14, 1992, (now abandoned) which is a continuation-in-part of U.S. application Ser. No. 07/586,957 filed on Sep. 24, 1990 (now abandoned in favor of continuation application Ser. No. 08/093,512 filed on Jul. 16, 1993) which is a division of U.S. application Ser. No. 07/127,999 filed on Dec. 2, 1987, now U.S. Pat. No. 4,959,810, which is a continuation-in-part of U.S. application Ser. No. 07/109,336 filed on Oct. 14, 1987 (now abandoned).

BACKGROUND OF THE INVENTION

1. Field of the Invention

The present invention relates to a universal remote control in which function codes for generating operating code signals to be transmitted by the remote control are synthesized or generated by the operator of or external to the remote control by depressing certain keys or buttons on the remote control identified in an accompanying list, or by transmitting information to it.

2. Description of the Related Art including information disclosed under 37 CFR §§1.97–1.99.

Universal remote controls are typically handheld devices capable of emitting infrared light modulated with information, which when received by equipment capable of processing such information, can control various functions of the equipment. A remote control is commonly called universal if it can send IR signals modulated by the codes pertaining to a wide variety of equipment, usually manufactured by different companies.

Presently, universal remote controls are of two principal types: learning, wherein the user can "teach" the universal remote control functions emitted by an existing "native" remote control; and pre-programmed, wherein the universal remote control is manufactured with codes to control a variety of equipment already in its memory. One example of a learning remote control is disclosed in the Ehlers U.S. Pat. No. 4,626,848 and one example of a pre-programmed remote control is disclosed in the Rumbolt et al U.S. Pat. No. 4,841,368.

A disadvantage of the learning remote control is that the user must possess a teaching remote control in order to program it, the teaching process is often cumbersome and confusing to the user, and there exist so many different IR modulation schemes that it is difficult to create a handheld device capable of "learning" them all.

A disadvantage of the pre-programmed remote control is that manufacturers are continuously devising new coding schemes and adding new functions to existing coding schemes. Pre-programmed universal remote controls whose information is permanently stored in ROM can thus become obsolete. Also, because the amount of memory available in any practical product is finite, a typical pre-programmed remote control will contain only a subset of the codes currently in use at the time of its manufacture.

One solution to the inability to add codes to a ROM-based pre-programmed remote control is to provide a writable non-volatile memory in the remote control, along with an information channel, such as a serial port, via which new codes can be "downloaded" to the remote control. Just such a remote control is disclosed in the Darbee et al U.S. Pat. No. 4,959,810. However, such an "upgradeable" remote control requires attachment to a source of new programming, such as a computer or modem link to a remote computer.

The present invention describes a method of endowing a remote control with the capability of sending control functions that are not actually stored in its memory, whether by learning, pre-programming, or upgrading.

SUMMARY OF THE INVENTION

According to the present invention there is provided a universal remote control comprising: light emitting circuitry; driver circuitry coupled to the light emitting circuitry; and, a microprocessor including a CPU coupled to the driver circuitry, structure, such as a keyboard, coupled to the CPU for communicating "code signal generation sequences" including a "code generate command" signal followed by a "code setting" signal to the CPU, a memory for storing information therein coupled to the CPU, program instructions stored in the memory, and signal determining and function code creating program and circuitry associated with the memory and the CPU for determining when a "code generation sequence" has been received and for using the "code setting" signal of the sequence received to create a function code signal comprising a specific IR blink code defined by a specific series of infra-red "light on-light off" pulses which define bits of a byte defining the function code signal for causing a controlled apparatus to execute a specific function, e.g., "volume up", and for energizing the driver circuitry to cause the light emitting circuitry to emit a specific series of infra-red "light on-light off" pulses defining the specific function code signal to be sent to the controlled apparatus.

Further according to the present invention there is provided a method for operating a remotely controlled apparatus using a remote control of the type described above, the method comprising the steps of: causing a "code generate command" signal to be generated to initiate code signal generation; supplying the "code generate command" signal to the CPU; causing a "code setting" signal to be generated for creating a specific function code; supplying the "code setting" signal to the CPU; generating with the program instructions the bits of a byte of a specific function code for generating a specific function code signal comprising an IR blink code of bits defined by a specific series of infra-red "light on-light off" pulses; and, transmitting the specific series of infra-red "light on-light off" pulses defining bits of a byte defining the function code signal to the controlled apparatus to cause the controlled apparatus to perform a specific function, e.g., "volume up".

An analogy can be made with musical instruments. Whereas pressing a key on a piano will "send" a piano note, pressing a key on a musical synthesizer will "send" a note that could sound like almost anything. The piano sounds like a piano because of the fixed (read-only) nature of its construction. The variability of the musical synthesizer is due to the ability of the user to change its settings and thereby the components from which the sound is constructed. The sound is synthesized from basic principles, such as waveform, frequency, attack, decay and other attributes described by parameters input by the user.

Likewise, it is possible to allow the user of a remote control to specify the parameters for the type of code he desires to send in order to control equipment. These parameters might include subcarrier frequency and duty cycle, modulation scheme, preamble structure, prefix data, function data, and code repetition protocol.

Because users of typical consumer remote controls cannot be expected to know the technical parameters of the codes required by their equipment, the remote control of the present invention provides means and a method for users of a remote control to set up a synthesizer remote control without such prior knowledge. Such a remote control constructed according to the teachings of the present invention can:

1. send codes which the remote control has not been pre-programmed or taught to send, 2. be manufactured without any settings, but can be customized to emulate any of a wide range of existing remote controls, 3. be customized by the user in terms of what each key on the remote control will do.

DESCRIPTION OF THE PREFERRED EMBODIMENT

Figure 1:
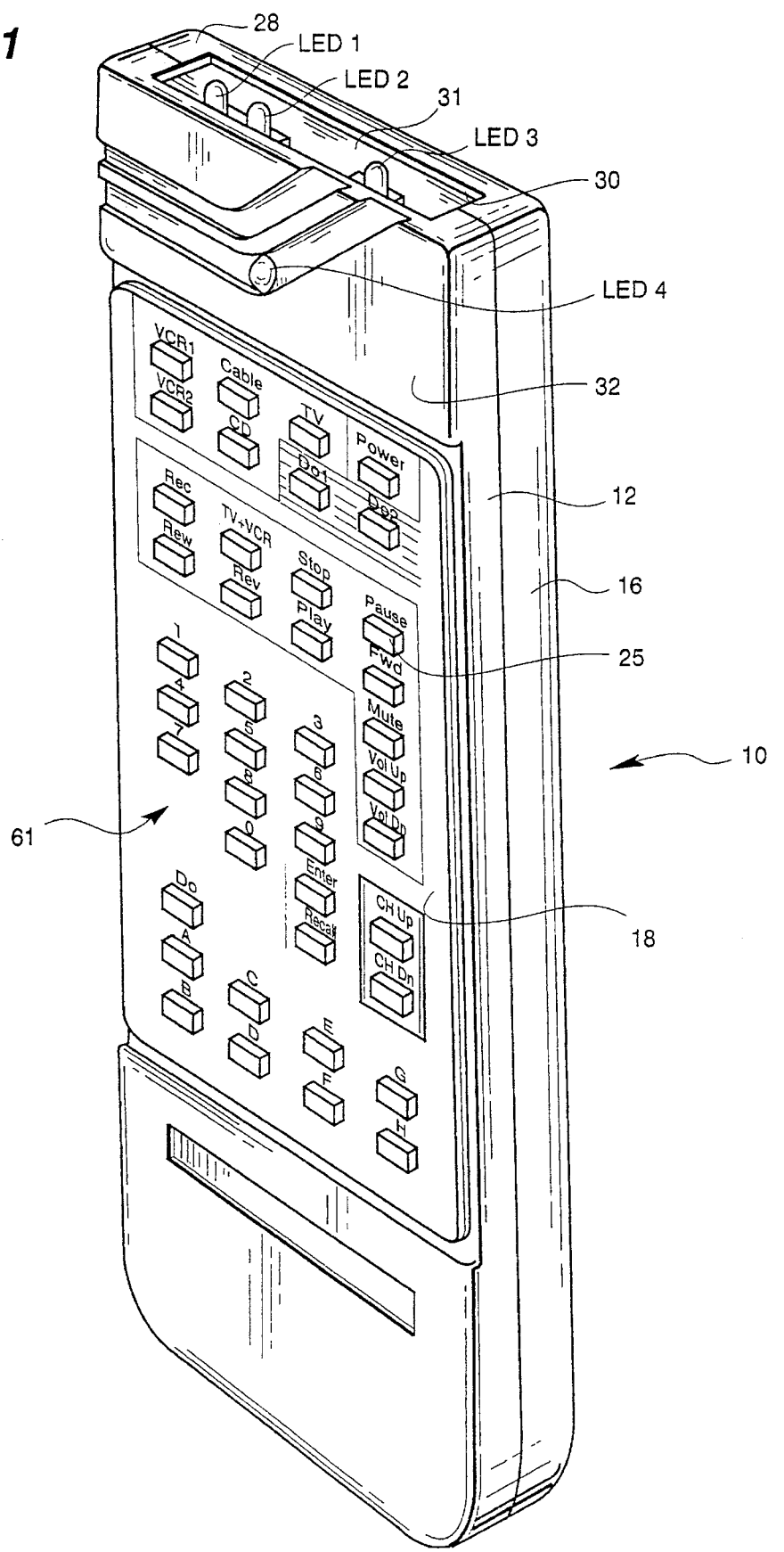
FIG. 1 is a front perspective view of one universal remote control constructed according to the teachings of the present invention.

Referring now to FIG. 1 in greater detail, there ie illustrated therein a universal remote control 10 constructed according to the teachings of the present invention.

As shown, the remote control 10 includes a housing 11 including an upper housing member 12 having a base panel 14, and a lower housing member 16. An overlay face panel 18 is positioned over the base panel 14.

Figure 2:
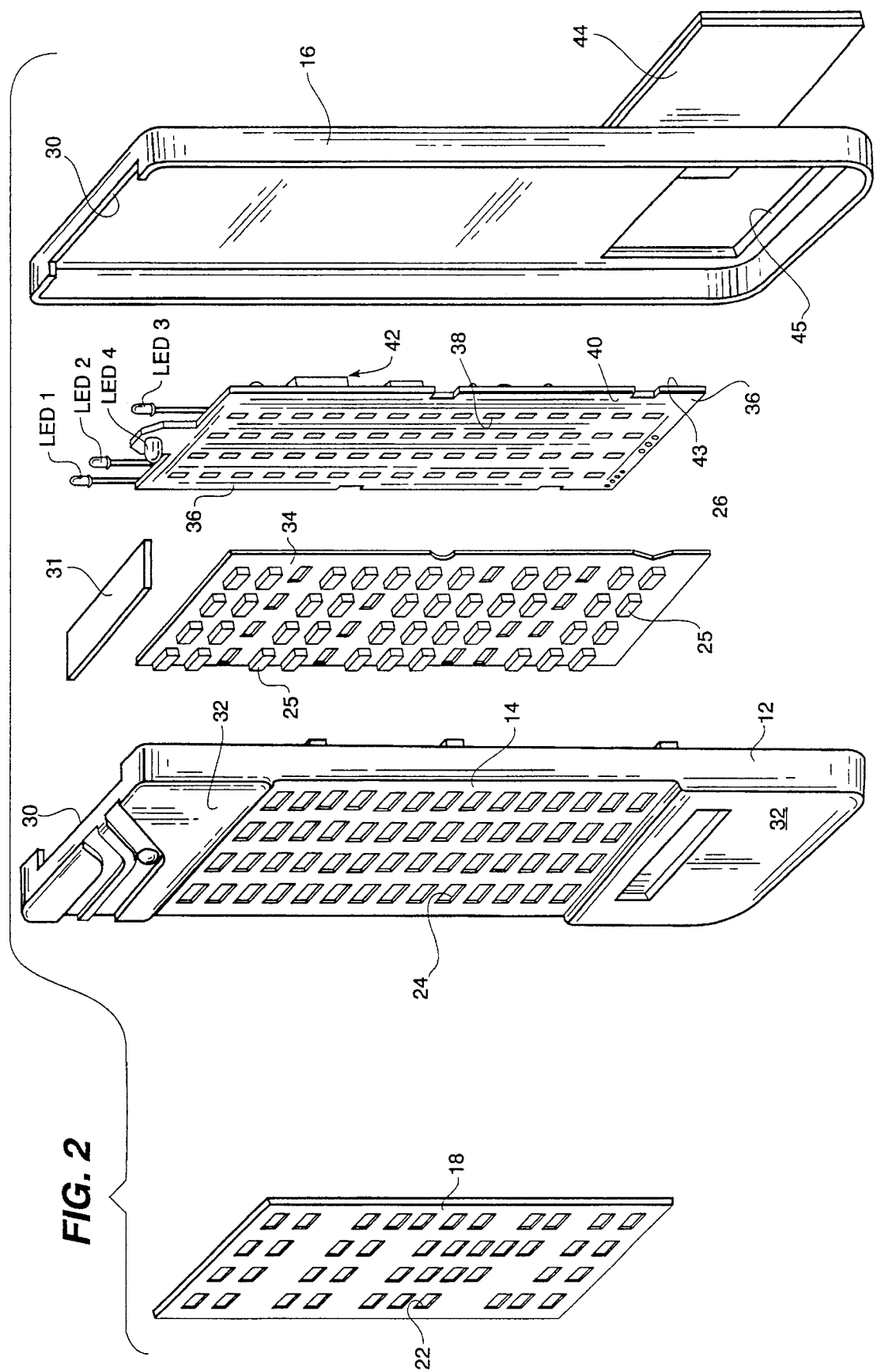
FIG. 2 is an exploded perspective view of the remote control shown in FIG. 1.

The two panels 14 and 18 have openings 22 and 24 therethrough for receiving elastomeric pushbuttons 25, all of which extend from and are fixed to or integral with an elastomeric body panel 26 is shown in FIG. 2.

The pushbuttons 25 are arranged in rows and columns and are identified as follows on the overlay face panel 18:

| VCR 1 | Cable | TV | Power |
| --- | --- | --- | --- |
| VCR 2 | CD | DO 1 | DO 2 |
| Rec | TV . VCR | Stop | Pause |
| Rew | Reverse | Play | Fast Fwd |
| | | | Mute |
| 1 | 2 | 3 | Vol Up |
| 4 | 5 | 6 | Vol Dn |
| 7 | 8 | 9 | |

-continued

| | 0 | Enter | CH Up |
| --- | --- | --- | --- |
| | | Recall | CH Dn |
| DO | | | |
| A | C | E | G |
| B | D | F | H |

Figure 6:
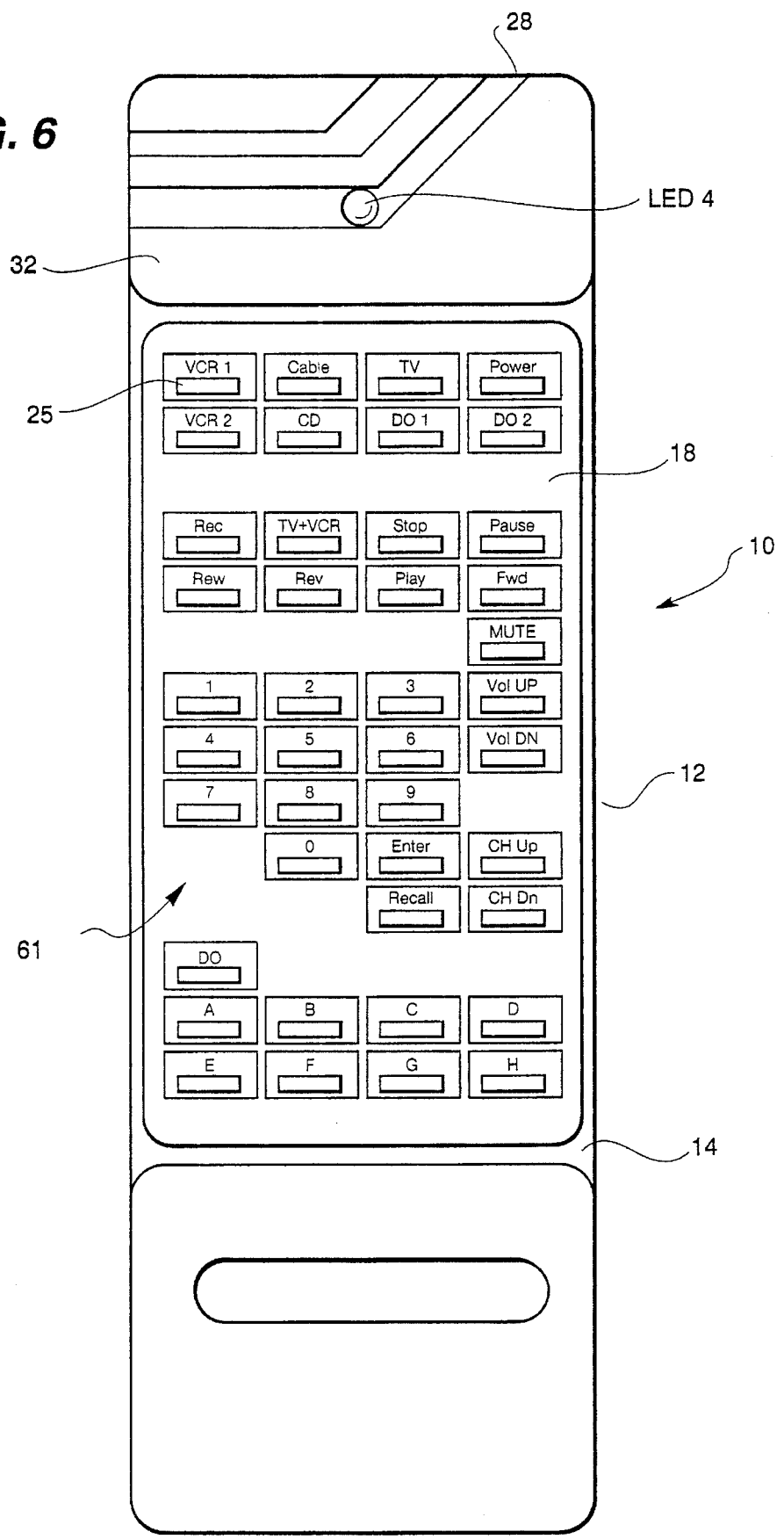
FIG. 6 is a front plan view of the remote control shown in FIG. 1 and shows the various pushbuttons or keys of the remote control.

This arrangement is shown in FIG. 6 and the manner in which these pushbuttons 25 are utilized in operating the remote control 10 will be described in greater detail in connection with the description of FIG. 7.

At a top or forward end 28 of the remote control 10, there is provided an opening 30 for three light emitting diodes, LED 1, LED 2 and LED 3. The opening 30 is covered by an infrared-transparent lens 31. Also, provided on a top surface 32 of the upper housing member 12 of the control device 10 is a light emitting diode, LED 4, by which information, in the form of red and green blink codes, is communicated to the user of the remote control 10.

FIG. 2 is an exploded view of the components of the remote control 10. As shown, the remote control 10 includes the overlay face panel 18 with pushbutton-receiving, generally rectangular openings 22, the upper housing member 12 with base panel 14 having a plurality of generally rectangular, pushbutton receiving openings 24, the elastomeric body panel 26 having pushbuttons 25 extending from an upper surface 34 thereof, a printed circuit board 36 having conductive switches 38 on an upper surface 40 thereof and operating circuitry 42 (FIG. 3, 4, 5A and 5B) mounted on the underside 43 thereof, the lower housing member 16, a cover 44 for a battery compartment 45 (FIG. 3, 4, 5A and 5B) for receiving batteries 46 (FIG. 4) for the circuitry 42 of the control remote control 10, and the infrared-transparent lens 31.

It will be noted that the base panel 14 of the upper housing member 12 has pushbutton openings 24 completely across each one of fourteen (14) rows across and four (4) columns down. However, not all of these openings or holes 24 have pushbuttons 25 extending therethrough, as noted by the lesser number of pushbutton-receiving openings 22, in the overlay face panel 18. Likewise, the body panel 26 initially has pushbuttons 25 arranged completely across the upper surface 34 in fourteen (14) rows across and fourteen (14) columns down.

The printed circuit board 36 has conductive switches 38 aligned with each one of the pushbuttons 25 so that more switches 38 are provided than may be necessary for this particular control remote control 10.

The availability of additional pushbutton openings 24 in the base panel 14 will enable the control remote control 10 to be modified as necessary by the addition of further pushbuttons 25 to perform numerous other functions as called for.

This mechanical construction of the upper and lower housing members 12 and 16 and the panels 14 and 18 and circuit board 36 enable the control remote control 10 to be modified to include additional circuits in the operating circuitry 42 and pushbutton switches 25 for performing additional functions, if desired. In this respect, overlay face panel 18 is easily replaceable to modify the remote control 10 to include more or less pushbuttons 25 and associated switches 38.

Figure 3:
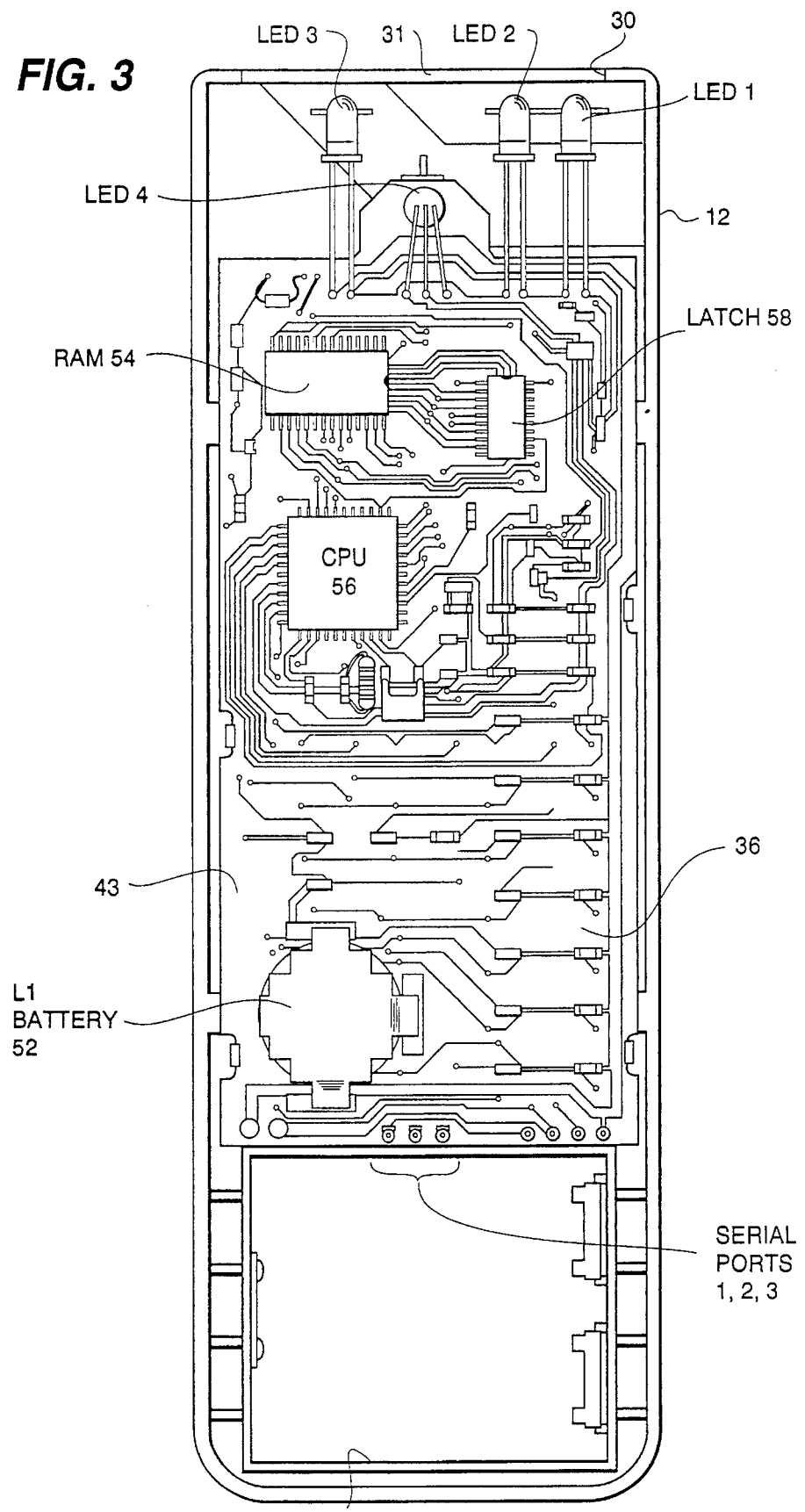
FIG. 3 is a plan view of the circuit board assembly mounted inside the remote control viewing the remote control from the back side thereof with a back cover panel removed.

Referring now to FIG. 3, there is illustrated therein the operating circuitry 42 of the control remote control 10 which includes batteries 46 (FIG. 4) mounted in the compartment 45 for providing power for the circuitry 42 and a lithium battery 52, which backs up a memory 54. A central processing unit (CPU) 56, is coupled through a latch 58 to the memory 54. Three LEDs, LED 1, LED 2, and LED 3 are coupled to the circuitry 42 for communication with the apparatus to be controlled. All elements of the circuitry 42 are mounted on the circuit board 36 mounted in the upper housing member 12. A further LED, LED 4 is coupled to CPU 56 for communication with the user of the remote control 10 as will be described in greater detail below.

Figure 4:
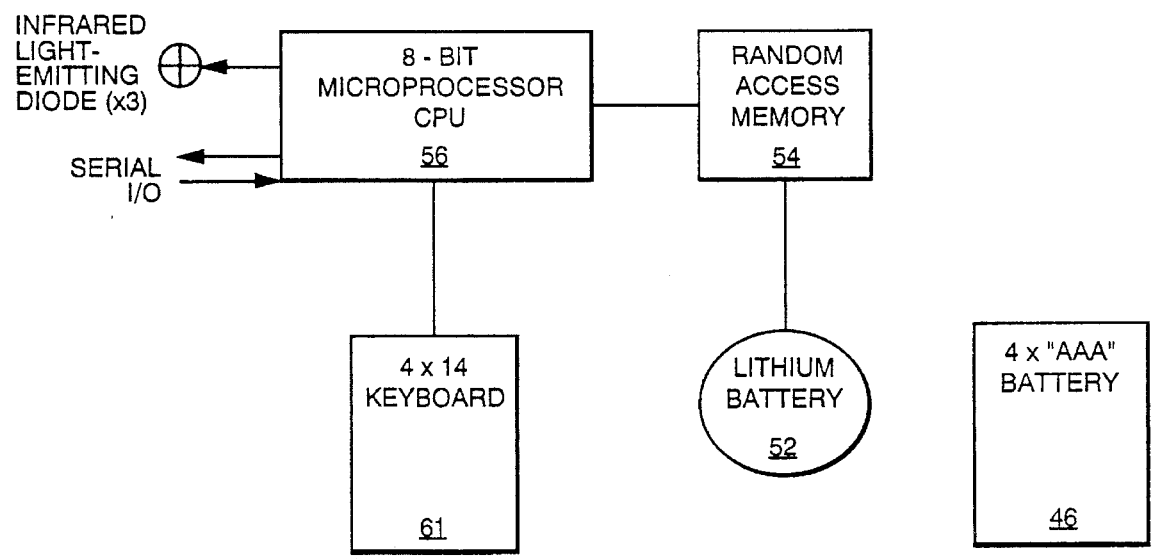
FIG. 4 is a block diagram of the operating circuitry in the remote control.

A block schematic circuit diagram of the operating circuitry 42 is shown in FIG. 4 and includes CPU 56, the infrared light emitting diodes, LED 1, LED 2, and LED 3 coupled to the CPU 56, serial input/output ports 60 of CPU 56, the RAM 54 coupled to CPU 56 and backed up by lithium battery 52 and a 4×14 keyboard 61 coupled to CPU 56. The four AAA batteries 46 are also shown.

Figure 5A:
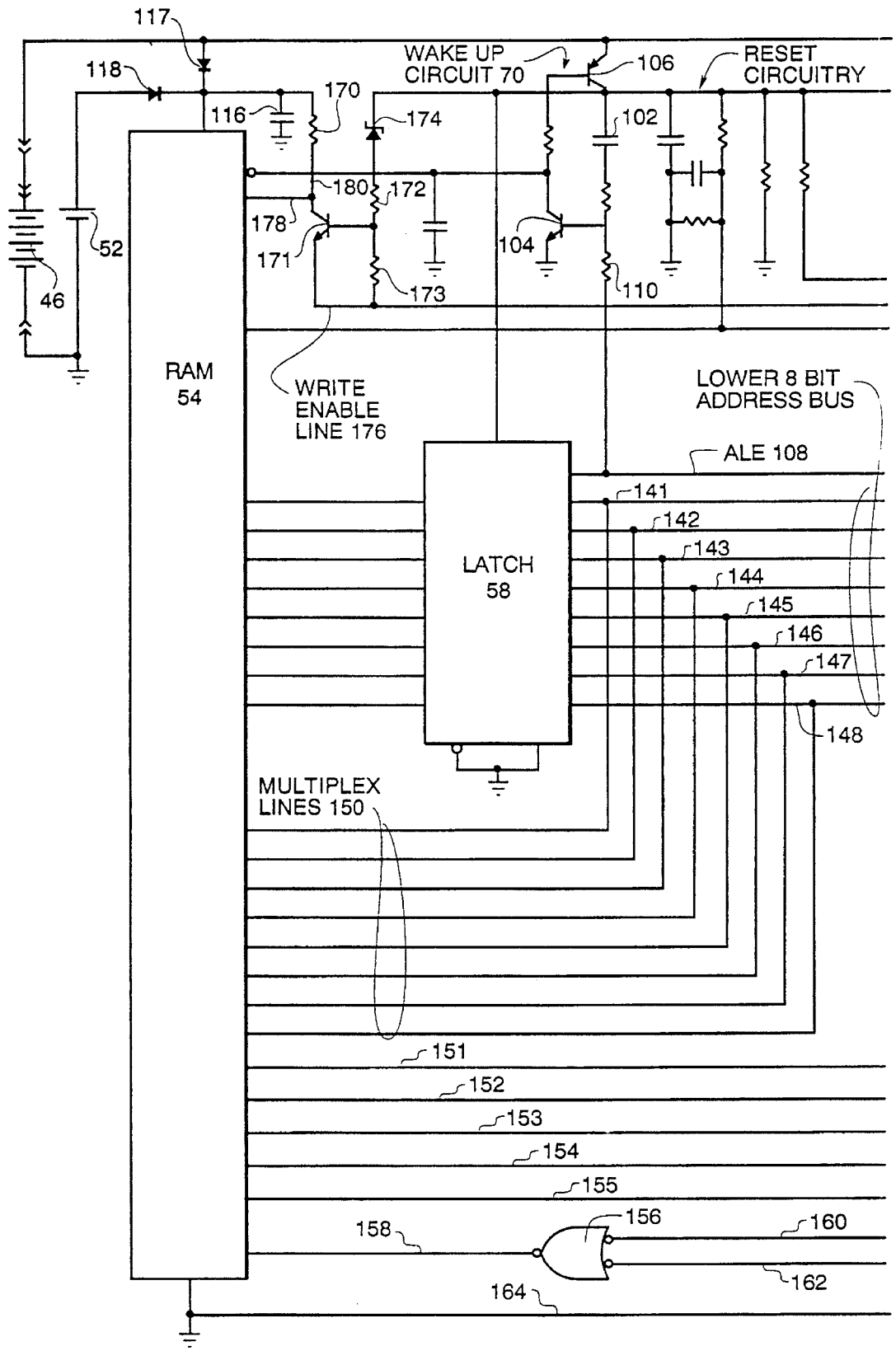
FIGS. 5A & 5B are a detailed schematic circuit diagram of the operating circuitry shown in FIG. 4.
Figure 5B:
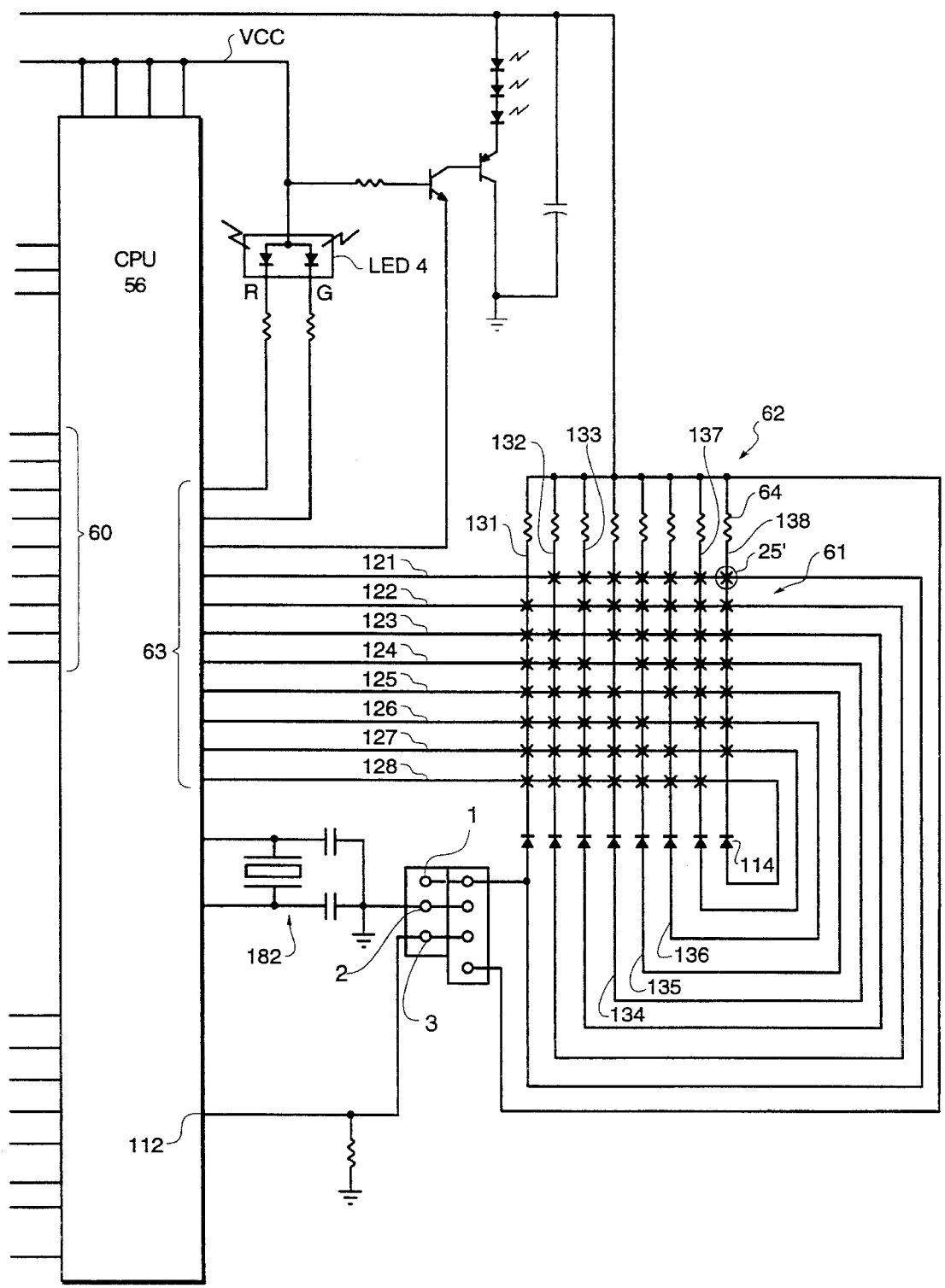

FIGS. 5A and 5B are a detailed schematic circuit diagram of the operating circuitry 42. The operating circuit 42 includes the central processing unit 56, the latch 58, the random access memory 54 and LED 1, LED 2, LED 3 and LED 4.

The operating circuitry also includes several subcircuits. One of those subcircuits 62 (FIG. 5B) includes the keyboard 61 having pushbuttons 25, each of which is connected to a port 63 of the CPU 56 shown in FIG. 5B and can be referred to as the keyboard circuit 62. The X's in FIG. 5B indicate the pushbuttons 25 and when one of those pushbuttons X is pressed, current flows through a resistor in a column line, e.g., when button 25' is pressed current flows through resistor 64 in column line 138 going to the button or key 25'. That raises the voltage on a supply line VCC to the CPU 56 of the microprocessor.

Accordingly, whenever a button 25 is pressed, it will increase the voltage on line VCC which initiates a switching process in a wake up circuit 70 for "waking up" or energizing the CPU 56 in the manner described below.

In addition to the keyboard circuit 62 and the wakeup circuit 70, the subcircuits include a reset circuit 74, and a write protect circuit 78.

When the voltage on line VCC goes up, a signal is passed through capacitor 102, to the base of a transistor 104 in the wake up circuit 70. This turns on the transistor 104 which in turn turns on transistor 106 This turning on of the transistors 104 and 106 will bring voltage on line VCC to the full DC voltage of about 5½ volts. When the voltage on line VCC reaches 5½ volts, the CPU 56 begins to operate.

When operating, the CPU 56 establishes a signal on line ALE 108 which is passed through a resistor 110 and filtered by capacitor 102. Once the ALE signal is established, it causes a voltage to be generated at the base of transistor 104, maintaining transistor 104 turned on, which in turn maintains transistor 106 turned on, thus enabling the CPU 56 to continue to run. The CPU 56 can turn itself off by executing a HALT instruction which causes the ALE signal to cease, thus turning off transistors 104 and 106 and removing power via line VCC to the CPU 56.

It is to be noted that the wake up circuit 70 can be activated by depression of a key or button 25 or by an input signal at serial port 3 (FIGS. 3 and 5B), coupled to an input port 112 of the CPU 56.

The circuit elements described above form the wakeup circuit 70 for activating the operating circuitry 42 of the remote control 10. This circuit uses substrate static-protection diodes 114 in a CMOS chip coupled to the keyboard 61. With this arrangement, source current is supplied to transistor 104 via line VCC when a key or pushbutton 25 is depressed.

The memory 54 is connected to the lithium battery 52 and, when the remote control 10 is not being used, draws about 20 nanoamps from the battery 52, which gives the remote control 10 a shelf life between 5 and 10 years. A backup capacitor 116 is coupled to the memory 54 and has (at 20 nanoamps) a discharge time of about 10 minutes, providing ample time to change (if necessary) the battery 52 without losing the instructions and data stored in the memory 54. Capacitor 116 is kept charged by battery 46 through diode 117 when the remote control 10 is operating and, at other times, by battery 52 through diode 118.

After the CPU 56 has been powered up, or awakened, the CPU 56 makes a scan of row lines 121–128 to the keyboard 61 by sequentially forcing each line 121–128 low and then polling the other lines to find out which button 25, such as button 25', has been pressed. As a result of pushbutton 25' being pressed, a low impressed upon row line 121 will cause a low on column line 128 and that will result in the row line 128 being low.

The CPU 56 first sets row line 121 low and then begins scanning, starting with the row line 122, for another row line having a low voltage thereon and by finding the row line with the low voltage, in the above example, row line 128, the CPU 56 knows that button 25' at the intersection of row line 128 and column line 138 has been depressed.

If the CPU 56 had not found a low on another row line, such as row line 128, after having set line row 121 low, line 121 is returned to its previous value and row line 122 is then set low, and the scan continued until a low row line is found to identify which button 25 has been depressed.

When the CPU 56 determines which pushbutton 25 has been depressed the CPU 56 will then know what function is to be carried out.

It is to be noted that the keyboard circuit 62 is uniquely designed to include only eight (8) row lines 121–128 and eight (8) column lines 131–138 each having a resistor 64 and a current directing diode 114 therein and each being arranged across the row lines 131–138 so that 56 switch positions are provided with only eight (8) lines.

All memory cycles exercised must involve the latch 58 because the CPU 56 has its data bus multiplexed with the lower 8 bits of the address bus on lines 141–148.

Coming out of the CPU 56 to the latch 58, is a group of nine (9) lines 108 and 141–148. One of the lines, line 108, carries the ALE signal. The eight (8) lines 141–148 between the latch 58 and the CPU 56 are the multiplexed data and address bus lines. These lines comprise the lower 8 bits of the address bus. A group of multiplex lines are identified with reference numeral 150. Five more lines 151–155 comprise the upper five bits of the address bus, making a total of 13 bits of address.

An inverting OR gate 156 having an output line 158 and two input lines 160 and 162 together with ground line 164 are coupled between the CPU 56 and the memory 54. The line 158 defines an output enable for the memory 54.

Accordingly, when the CPU 56 wants to do a read, it actuates either of the two input lines 160 or 162 going into the OR gate 156. Line 160 is a PSEN line for telling the memory 54 that it is to be enabled to receive data and line 162 is a Read Output line to tell the memory 54 that the CPU is going to read the information stored in the memory 54. With OR gate 156 the two lines and functions are combined on one line 158. In other words, the CPU 56 tells the memory 54, through the OR gate 156, that it wants to read information stored in the memory 54.

The circuitry 42 also includes the write protect circuit 78 which has the double duty of being a low battery indicating circuit. The circuit 78 includes a resistor 170, a transistor 171, two resistors 172, 173 and a Zener diode 174 connected as shown.

A write enable line 176 is connected between the transistor 171 and the CPU 56.

When the CPU 56 desires to write information into the memory 54, it places the address on the address bus lines 141–148 and 151–155, strobes the lower 8 bits of the address bus on lines 141–148 into the latch 58 using ALE line 108, places the information on the data bus lines 141–148, and then brings the write enable line 176 low.

When the write enable line 176 goes low, unless the transistor 171 is turned on by virtue of the battery voltage being more than 4.3 volts, a line 178 going into the memory 54 at the collector 180 of the transistor 171 (which is the "write enable" for the memory 54), is prevented from going low, maintaining the memory "Write Protected". This condition also is created when the battery 46 is low. The "write enable" line 176 also functions as a low battery detector because, during execution of the program, a check is made to see whether writing to the memory 54 is enabled. If it is not, this shows that the batteries are weak and a signal is sent to the user by flashing the red LED, of LED 4, 5 times.

Note that LED 4 includes a red LED and a green LED incorporated into one package so that when both LEDs are turned on, a yellow light is emitted, making LED 4 a tricolor LED. Such tricolor LED 4 enables the remote control 10 easily to communicate to the user by way of the color, number and sequence of light blinks.

A clock circuit 182 including a crystal resonator is coupled to the CPU 56.

The three infrared-emitting LEDs, LED 1, LED 2, and LED 3 are connected in the circuitry 42 as shown.

The reset circuit 74 includes two resistors and a capacitor connected as shown and coupled between line VCC and a reset line 184.

Deciphered infrared code data for operating various pieces of equipment of different manufacturers and instructions for generating such code are stored in the memory, such as the RAM 54.

Figure 7:
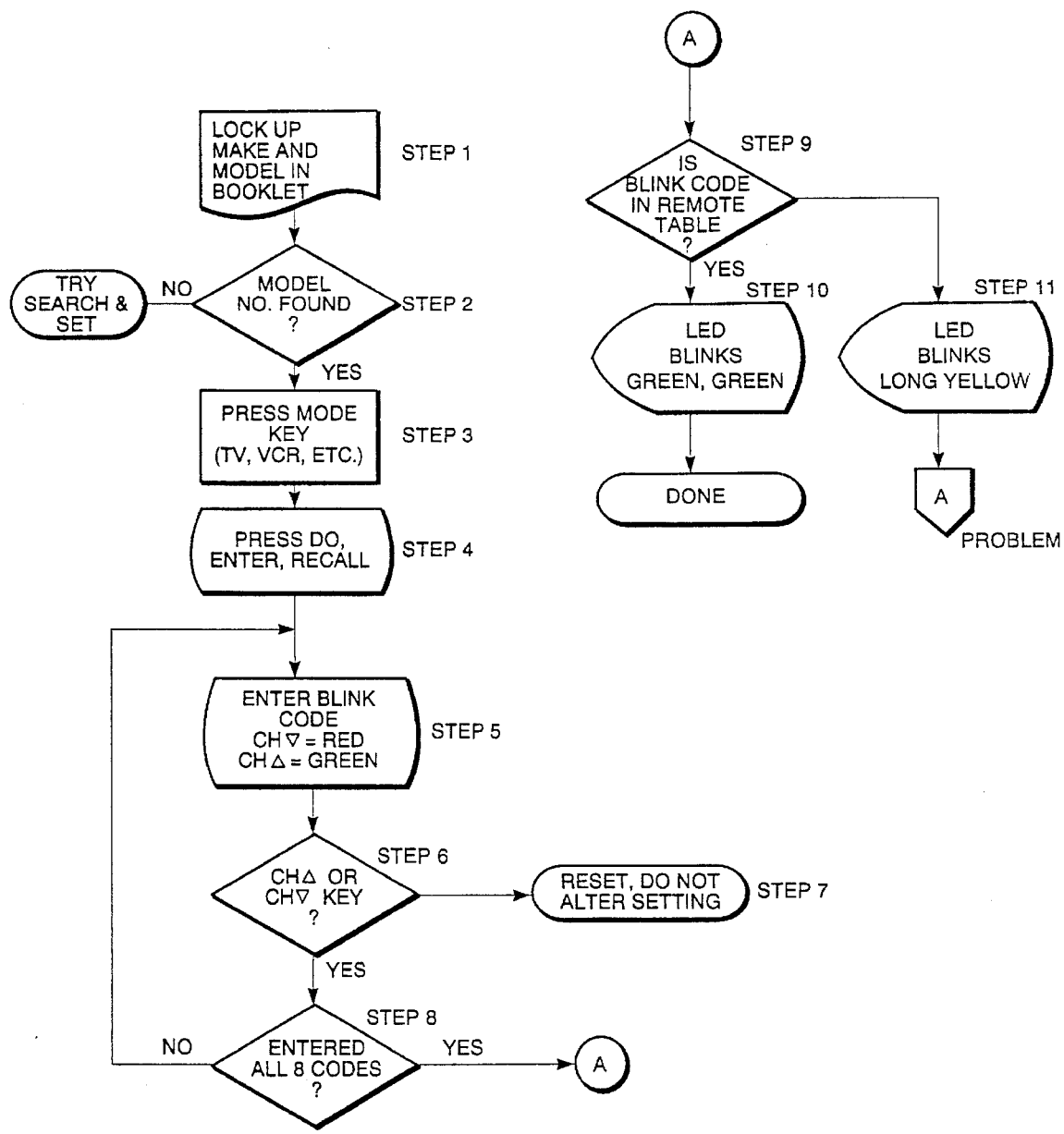
FIG. 7 is a flow chart of a direct-entry quick set procedure followed in using this remote control.

FIG. 7 is a flow chart of the steps initiated by a user in carrying out a direct-entry/quick-set procedure for matching the user's equipment or apparatus to the device 10.

The steps of this procedure include:

STEP 1. Look up make and model number of the controlled apparatus in a table provided to the user in an instruction booklet.

STEP 2. Model number is found and matched with a series of 8 "R"s and "G"s.

STEP 3. Here the operator presses the desired mode button or key.

STEP 4. Press DO, Enter, Recall. This tells the device 10 to do a Quick-Match.

STEP 5. Next enter the sequence of eight red and green blinks found in TABLE I (set forth below) provided in the instruction booklet. This is done by pressing Channel Down for "R" and Channel Up for "G".

STEP 6. Here determination is made if a key other than Channel Up or Channel Down was pressed.

STEP 7. In the device 10, the tricolor LED 4 will flash red or green depending on what button is pushed.

STEP 8. When all eight codes are entered, the program goes on to STEP 9.

STEP 9. Here a check is made to see if the blink code corresponding to the red/green code is in a table in the RAM 54 of the remote control device 10.

STEP 10. If the device 10 has successfully Quick-Matched to the controlled apparatus, the LED 4 will flash green twice.

STEP 11. If it did not match, it will flash yellow indicating that codes for that controlled apparatus are not loaded into the RAM 54.

TABLE 1

DEVICE BLINK CODES AND SPECIAL FEATURE BUTTONS

| Blink Code | A | B | C | D | E | F | G | H |
|---|---|---|---|---|---|---|---|---|
| | | | TELEVISION SETS | | | | | |
| RRRR RRRR | Display | MTS | Pict+ | Pict− | Sleep | TV/Video | Ant | Tone |
| | 25 = Col Up | 26 = Col Dn | 27 = Brt Up | 28 = Brt Dn | 29 = Hue Up | 30 = Hue Dn | 31 = Mtx | 32 = Reset |
| RRRG RRRG | Screen Dn | Sp Phne/ Print Ctl | AutoOn/ Data Ent | AutoOff/ Data Clr | Ant | Stereo | | |
| RRRG RGRG | Add | Clear | | | | | | |
| RRRG GRRR | A Ch | Hi Fi | | | | | | |
| RRRG GRGR | Ant/Aux | Time/Ch | Program | TV/VCR | | | | |
| RRRG GGGR | Ant/Aux | Time/Ch | | | | | | |
| RRRG GGGG | Pwr On | Pwr Off | Display | Ant | | | | |
| GRRG RRRG | Aux | Last Ch | Timer | | | | | |
| GRRG RRGG | Fine Up | Fine Dn | L Ctl | R Ctl | OBC | Func | Review | BiLing |
| | 25 = Stereo | 26 = TimeFa | 27 = Timer | 28 = TimeS1 | 29 = TV/AV | | | |
| GRRG RGRR | Fine Up | Fine Dn | L Ctl | R Ctl | OBC | Func | Review | Biling |
| | 25 = Stereo | 26 = TimeFa | 27 = Timer | 28 = TimeS1 | 29 = TV/AV | | | |
| GRRG RGGR | Tint R | Tint L | Color R | Color L | Contr R | Contr L | Timer | Stereo |
| | 24 = SAP | 25 = Reset | 26 = Q/V | 27 = EXP | 28 = Disp | 29 = Mono | 30 = Lock | 31 = TV |
| | 32 = Ext 1 | 33 = Ext 2 | 34 = Ant | | | | | |
| GRRG GRRG | TV/Video | Time | | | | | | |
| GRRG GRGR | TV/Video | Wide | Lvl Up | Lvl Dn | Memory | Func | MTC | Stereo |
| | 25 = Timer | 26 = 100 | 27 = BiLing | | | | | |
| GRRG GRGG | 10 | 11 | 12 | 13 | | | | |
| GRRG GGRR | RF12 | Ch Rtn | Str SAP | Mono | Timer | T Set | TV/CATV | TV/Vid |
| | 26 = 100 | 27 = Audio | 28 = CCC1 | 29 = CCC2 | 30 = CCC3 | 31 = CCC4 | 32 = ContDn | 33 = ContUp |
| | 34 = Pict | 35 = Reset | | | | | | |
| GRGG RRRR | Sleep | Review | | | | | | |
| GRGG RRRG | K | L | | | | | | |

TABLE 1-continued
DEVICE BLINK CODES AND SPECIAL FEATURE BUTTONS

| Blink Code | A | B | C | D | E | F | G | H |
|---|---|---|---|---|---|---|---|---|
| GRGG RRGR | SAP | Sleep | TV/Video | | | | | |
| GRGG RRGG | Program | Q Rev | SAP | Sleep | TV Video | Add | Delete | |
| GRGG RGRG | Sleep | St/SAP | TV/Video | | | | | |
| GRGG RGGR | 11 | 12 | 13 | 14 | 15 | 16 | | |
| GRGG RGGG | K | L | | | | | | |
| GRGG GRRR | K | L | | | | | | |
| VIDEO CASSETTE RECORDERS | | | | | | | | |
| RRRR RRRR | Nse Cncl | | | | | | | |
| RRGR RRRG | Ant | | | | | | | |
| RRGR RRGR | Ant | | | | | | | |
| RRGR RRGG | Frm Adv | Slow | Slow Up | Slow Dn | Srch Fwd | Srch Rev | | |
| RRGR RGRR | A | B | C | D | E | F | Slow | |
| RRGR GGGR | Slow | | | | | | | |
| RRGR RGGR | Slow+ <br> 28 = Shift | Slow– <br> 29 = Reset | Eject <br> 30 = Mem/PS | CM Skip <br> 31 = SR | Program | Input | Mode | AM/PM |
| RRGR RGGG | Forward | FlshBack | Ant | Vol+ | Vol– | Reverse | Sp Phne | PC |
| RRGR GRRR | Ant/Aux | | | | | | | |
| RRGR GRRG | 11 | 12 | 13 | 14 | 15 | 16 | | |
| RRGR GRGR | Frm Adv | Memory | Reset | Chg Time | | | | |
| RRGR GGRG | Pwr On | Pwr Off | | | | | | |
| RRGR GGGG | Slow <br> 29 = Frame <br> 37 = Clock | Slow Up <br> 30 = Memory <br> 38 = APS | Slow Dn <br> 31 = Prog <br> 39 = 100 | Set Up <br> 32 = Qtr | Set Dn <br> 33 = QtrStr | Timer <br> 34 = Quick | Clear <br> 35 = Remain | Display <br> 36 = Rst |
| GGRG RRRR | K | L | | | | | | |
| GGRG RRRG | CFM | Slow | | | | | | |
| GGRG RRGR | Slow <br> 28 = Timer | OSP | Shift L | Shift R | Slow Dn | Slow Up | St+ | St– |
| GGRG RRGG | 11 | 12 | 13 | 14 | 15 | 16 | Slow | |
| GGRG RGRR | Slow Dn | Slow Up | Slow | | | | | |
| CABLE CONVERTERS | | | | | | | | |
| RRRR RRGR | A/B | Add | Delete | Set | Lock | Last Ch | | |
| RRRR RRGG | A <br> 25 = F | B <br> 26 = K | Event (*) <br> 27 = Learn | # <br> 28 = PGM | Arrow Up <br> 29 = TCP | Arrow Dn <br> 30 = Enter | AP | Delete |
| RRRR RGRR | Skew L | Skew R | Audio | SAT | Ant East | Ant West | | |
| RRRR RGRG | Plus <br> 22 = C/R | Minus <br> 23 = # | Dot | Box | Str | Clear | Time | Auth |
| RRRR RGGR | Prog | Auth | | | | | | |
| RRRR RGGG | Auth | | | | | | | |
| RRRR GRRR | Auth | Prog | | | | | | |
| RRRR GRRG | Plus | Minus | Rcp | * | M1 | M2 | M3 | M4 |
| RRRR GRGR | A–B | Dot 1 | Dot 2 | * | Am | Dm | F | |
| RARR GRGG | Arrow Up | Arrow Dn | | | | | | |
| COMPACT DISK PLAYERS | | | | | | | | |
| RRRR RRRR | CD Fwd | CD BckUp | | | | | | |
| GRRG GRGG | Fwd Indx | Rev Indx | Repeat | Memory | | | | |

*For numbered functions, press "DO" then the two-digit number.

Figure 8:
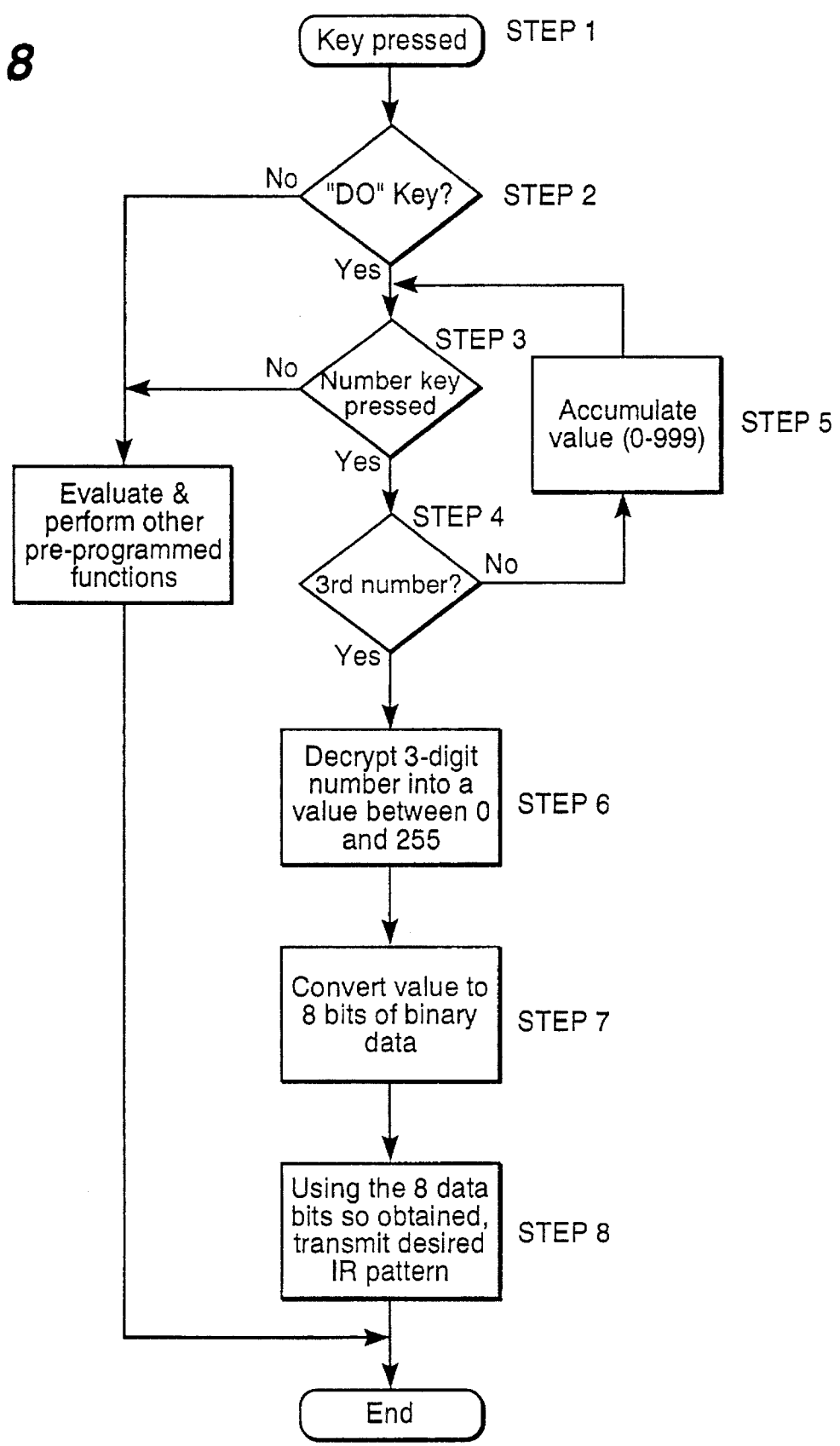
FIG. 8 is a flow chart of a method for generating an infrared code.

Referring now to FIG. 8 there is illustrated therein a method for using the remote control 10 described above for enabling an operator to create function codes for generating operating code IR signals to be transmitted by the remote control 10 for operating a controlled apparatus such as a television, VCR, cable box, etc.

Such function codes and operating code IR signals generated thereby contain data needed to operate a control device. In this respect, there are two distinct aspects to a typical remote control code:

1. The Protocol

Information sent to the receiving equipment is formatted in a particular pattern, or protocol. One piece of equipment will normally be expecting one protocol which it can understand, and it will reject any others. Therefore, it will not be falsed by control codes intended for other equipment, or by noise. Such protocols have evolved in the marketplace by the development of various hardware chips which have been incorporated into single-purpose "native" remote controls specific to a piece of equipment. Universal remote controls are typically software-driven microprocessor-based remote controls, where software routines are used to emulate the various protocols embodied in the hardware chips. Such a software emulation of a protocol can be defined as an "exec" (short for executor).

2. The Data

Execs send data. The amount of data sent by a typical handheld remote control is small, because the number of keys on a handheld remote control is necessarily limited. In particular, one eight-bit byte of data corresponding to a keypress would allow 256 distinct keys on the handheld remote control. Needless to say, a 256-key handheld remote control would be cumbersome to use. In particular, six bits (allowing 64 keys) is typical.

So that a single protocol can be used with a variety of equipment, there is often attached additional information, typically one or two bytes, which can be defined as a "prefix".

If an operator knows what exec to use, what prefixes to send, and what the keypress data is, the operator has sufficient information for a given piece of equipment to cause a control device to hear and respond to the command sent by the operator from the remote control.

Normally, if an operator wants to make a preprogrammed remote control that can send as many functions as are known by those who preprogram remote controls, the operator needs to have a list of those functions. If the operator doesn't fully understand the coding scheme for the data that is being sent, the remote control needs to have some inefficient storage means for storing all of the code data for those functions. If the operator understands or has "cracked" the code, the operator can efficiently store the list of those functions. In practice, the operator can use one byte (or less) of code per function if the operator has "cracked" the code.

For real codes of one byte or less, there can be at least two hundred fifty-six codes for a given receiving controlled apparatus.

Some codes are necessary for the operation of a controlled apparatus. An example is Channel Up and Channel Down for a TV. If the operator had "cracked" the codes for that TV, the operator would have to devote a byte of storage for each function that TV could respond to.

Now, it is desirable that the number of keys on a remote control be as small as possible so that the user will not become confused by the complexity of the handset. Also, on a universal remote control, there is a labeling problem, in that keys need to do different things depending on what kind of controlled apparatus it is controlling at the time. As a result, on handheld remote controls, there are not enough keys to send all of the function codes for complex controlled apparatus.

If there are fewer keys than desired functions, there is no other choice than to require multiple keystrokes of the available keys to send the additional (or "extended") function codes. For example, a remote control lacking "Color-Up" and "Color-Down" keys might require the user to type "Shift" (or some equivalent "escape" key) and key or keys "27" to send Color-up and key or keys "Shift 28" to send Color-Down.

Inside of such a remote control, there must be firmware or software for mapping "Shift 27" to a STORED Color-Up data byte and the "Shift 28" to a STORED Color-Down data byte and such bytes for such "extended functions" must be stored in the limited (and expensive) memory of the remote control.

Since function codes differ from device to device (e.g. the code for "color up" on a Sony TV will not typically be the same as the code for "color up" on an RCA TV), such stored data must be repeated for every type of equipment to be controlled.

With the remote control 10 of the present invention and the operating program and possible lookup tables stored therein, it is not necessary to use up memory to store such functions. Instead, the remote control can accept from the user directly the (typically one) byte that needs to be sent in the current context to the controlled apparatus. For example, the user can type "Shift 137" for Color-Down and "Shift 078" for Color-Up, as long as there is a one-to-one mapping between what the operator types on the keyboard and the byte the software needs in order to send the appropriate infrared function code.

According to the teachings of the present invention, software, including an operating program, algorithms such as an Executor Algorithm, and function code data for generating IR blink codes or a Look Up Table of such function codes are stored in the memory 54 of the remote control 10.

Further, a list of encrypted codes is provided in an instruction booklet for use by an operator in synthesizing or generating desired function code data. For example the instruction booklet will have the following type of information:

Sony TV, Model XYZ "Color Up" TYPE "DO" followed by "128."

This is an encrypted code which is decrypted or deciphered or demultiplexed by the remote control 10 hardware and/or software to a number between 001 and 256 representing a one byte value for generating an IR blink code, e.g., such as 074 converted to 01001010 for generating the appropriate IR LED blink code for causing the Sony TV to effect a "Color Up" function.

Many possible mechanisms exist by which decryption of such a code may be performed. For example, one such decryption is by the provision of a look up table in the remote control 10, such a table having data of the type set forth in Table II:

TABLE II

| Keystroke | Decrypted Code | Eight Bit Byte |
|-----------|----------------|----------------|
| 001       | 122            | 01111010       |
| .         | .              | .              |
| .         | .              | .              |
| 128       | 074            | 01001010       |
| .         | .              | .              |
| .         | .              | .              |
| 256       | 221            | 11011101       |

The steps of the routine or protocol stored in the memory 56 for carrying out the method of the present invention for creating the function codes for generating the IR code signals for operating a controlled apparatus is set forth in FIG. 7. These steps are as follows:

STEP 1. Has a key been depressed?

STEP 2. If a key has been depressed, is it the DO key which is a "code generating" or "code generate command-"key?

STEP 3. If the DO key has been depressed, at STEP 3 the program determines if it is a number key.

STEP 4. At STEP 4 if a number key has been depressed, the program determines if it is the 3rd number key.

STEP 5. At STEP 5 the decoder accumulates the key number to create a number between 0 and 999. STEPS 3, 4 and 5 are repeated until 3 digits have been pressed.

STEP 6. Here the program decrypts the three digit number entered at STEPS 3, 4 and 5 from a number between 0 and 999 to a number between 0 and 256.

STEP 7. Here the program converts the decrypted number obtained at STEP 10 to a one byte value (8 bits of binary data).

STEP 8. At STEP 8 the program operates a pattern generator using an Executor Algorithm to convert the one byte value into a function code for generating an IR blink code for a particular function of the controlled apparatus and supplies that blink code to an IR LED driver to emit that IR blink code from the remote control 10.

It is to be understood that the "code generate command" can be sent directly from a computer to the remote control via a direct connection to or through a modem connected to the remote control, bypassing the keys.

From the foregoing description it will be apparent that the remote control 10 and the hardware and software therein together with a list of codes in an instruction booklet of the present invention have a number of advantages, some of which have been described above and others of which are inherent in the invention. Accordingly, the scope of the invention is only to be limited as necessitated by the accompanying claims.

We claim:

1. A universal remote control comprising:

light emitting means;

driver circuitry coupled to said light emitting means; and, a microprocessor including:

a CPU coupled to said driver circuitry, communication means, coupled to said CPU, for communicating a "code signal generation sequence" including a "code generating" or "code generate command" signal followed by a "code setting" signal to said CPU;

memory means for storing information therein coupled to said CPU;

program instructions stored in said memory means; and, signal determining and function code creating means associated with said memory means and said CPU (a) for determining when said "code signal generation sequence" has been received by said CPU, (b) for using the "code setting" signal of the sequence received to create a function code signal comprising a specific IR blink code that includes a specific series of infra-red "light on-light off" pulses which define bits of a byte that defines the function code signal for causing a controlled apparatus to execute a specific function, and (c) for energizing said driver circuitry to cause said light emitting means to emit the specific series of infra-red "light on-light off" pulses which define the specific function code signal to be sent to the controlled apparatus.

2. The remote control of claim 1 wherein said "code setting" signal is a three number code sequence.

3. The remote control of claim 2 further including a keyboard and being combined with a list of "code setting" numbers for creating bits of bytes defining different function codes each including a 3-digit "code setting" sequence for being input through said keyboard into said memory means for enabling said program instructions to create bits of a byte for one of said different function codes for a specific function to be performed by a specific controlled apparatus.

4. The remote control of claim 1 wherein said CPU of said microprocessor uses said program instructions in said memory means of said microprocessor to decrypt, decipher or decode the "code setting" signal received by said CPU.

5. The remote control of claim 1 wherein said signal determining and function code creating means include an algorithm and a pattern generator for creating and generating the series of infra-red "light on-light off" pulses defining the bits of a byte for a specific function code signal.

6. The universal remote control of claim 1 further comprising:

a housing;

a set of keys forming a keyboard mounted to said housing and including a "code generate command" key and at least one "code setting" key;

said light emitting means being mounted to said housing;

said microprocessor being mounted in said housing;

electrical conductor means for coupling said keys to said CPU; and said signal determining and function code creating means including means for determining when a "code signal generation sequence" has been received by determining when said "code generate command" key has been struck or depressed, and which "code setting" key(s), if any, are struck or depressed after the striking of said "code generate command" key.

7. The remote control of claim 6 wherein said at least one "code setting" key includes three number keys.

8. A method for operating a remotely controlled apparatus using a remote control comprising: signal input means, light signal emitting means, and a microprocessor including a CPU, memory means for storing information therein coupled to the CPU and program instructions stored in the memory means and including an algorithm for creating different function code signals, each for causing the light signal emitting means to emit an IR blink code comprising a series of infra-red "light on-light off" pulses, defining bits of a byte which will cause the controlled apparatus to perform a specific function, said method comprising the steps of:

causing generation of a "code generate command" signal to initiate code signal generation;

supplying said "code generate command" signal to the CPU;

causing generation of a "code setting" signal for creating a specific function code;

supplying said "code setting" signal to the CPU;

generating with the program instructions the bits of a byte of said specific function code for generating a specific function code signal comprising an IR blink code defined by a specific series of infra-red "light on-light off" pulses; and, transmitting the specific series of infra-red "light on-light off" pulses to the controlled apparatus to cause the controlled apparatus to perform a specific function associated with the specific function code signal created.

9. The method of claim 8 wherein said "code setting" signal is a three number code.

10. The method of claim 8 wherein said "code setting" signal is an encrypted code signal and said method includes the additional step of decrypting, deciphering or decoding the "code setting" signal to enable the program instructions to create the bits of a byte defining said specific function code signal.

11. The method of claim 8 wherein said step of causing a "code generate command" signal to be generated is accomplished by depressing a "code generate command" key on a keyboard of the remote control and said step of causing a "code setting" signal to be generated is accomplished by depressing one or more selected "code setting" keys on the keyboard to initiate code generation.

12. The method of claim 11 wherein said step of generating said specific function code signal is accomplished by the depressing of said one or more selected "code setting" keys.

13. The method of claim 12 wherein said "code setting" keys are number keys.

14. The method of claim 12 wherein said "code setting" keys are three number keys.

* * * * *